United States Patent
Gooch et al.

(10) Patent No.: US 9,227,839 B2
(45) Date of Patent: Jan. 5, 2016

(54) WAFER LEVEL PACKAGED INFRARED (IR) FOCAL PLANE ARRAY (FPA) WITH EVANESCENT WAVE COUPLING

(71) Applicant: Raytheon Company, Waltham, MA (US)

(72) Inventors: Roland W. Gooch, Dallas, TX (US); Stephen H. Black, Buellton, CA (US); Thomas A. Kocian, Dallas, TX (US); Adam M. Kennedy, Santa Barbara, CA (US); Buu Q. Diep, Murphy, TX (US)

(73) Assignee: RAYTHEON COMPANY, Waltham, MA (US)

( * ) Notice: Subject to any disclaimer, the term of this patent is extended or adjusted under 35 U.S.C. 154(b) by 79 days.

(21) Appl. No.: 14/270,945

(22) Filed: May 6, 2014

(65) Prior Publication Data

US 2015/0321905 A1    Nov. 12, 2015

(51) Int. Cl.
| | |
|---|---|
| *H01L 23/02* | (2006.01) |
| *B81B 7/00* | (2006.01) |
| *H01L 37/00* | (2006.01) |

(52) U.S. Cl.
CPC .............. *B81B 7/0067* (2013.01); *H01L 37/00* (2013.01); *B81B 7/0035* (2013.01)

(58) Field of Classification Search
CPC ............... H01L 2924/00; H01L 2924/0002; H01L 2924/00014; H01L 31/0203; H01L 2924/1461; G01J 5/045; G01J 5/024; B81B 7/0077; B81B 7/007; B81C 2203/011
See application file for complete search history.

(56) References Cited

U.S. PATENT DOCUMENTS

| | | | |
|---|---|---|---|
| 5,063,081 A | 11/1991 | Cozzette et al. | |
| 5,496,743 A | 3/1996 | Luryi | |
| 6,297,072 B1 * | 10/2001 | Tilmans | B81B 7/0077 438/106 |
| 6,353,264 B1 | 3/2002 | Coronel et al. | |
| 6,479,320 B1 | 11/2002 | Gooch | |
| 6,521,477 B1 | 2/2003 | Gooch et al. | |
| 6,586,831 B2 | 7/2003 | Gooch et al. | |
| 6,661,949 B1 | 12/2003 | James et al. | |
| 6,750,521 B1 * | 6/2004 | Chilcott | B81B 7/007 257/414 |
| 6,785,458 B2 * | 8/2004 | Mule | G02B 6/10 385/131 |
| 6,815,828 B1 | 11/2004 | Coronel et al. | |
| 6,879,035 B2 | 4/2005 | Syllaios et al. | |
| 6,909,830 B2 | 6/2005 | Lee et al. | |
| 6,925,238 B2 | 8/2005 | Lee et al. | |
| 6,954,576 B2 | 10/2005 | Mule' et al. | |
| 7,015,074 B2 | 3/2006 | Syllaios et al. | |
| 7,034,935 B1 | 4/2006 | Kruzelecky | |

(Continued)

OTHER PUBLICATIONS

US Patent Application filed Nov. 2, 2012, 65 pages.

*Primary Examiner* — Jaehwan Oh
(74) *Attorney, Agent, or Firm* — Daly, Crowley, Mofford & Durkee, LLP

(57) ABSTRACT

A structure for detecting electromagnetic radiation having a predetermined wavelength. The structure includes a device wafer having a sensing element disposed on a predetermined region of a surface of the device wafer responsive to the electromagnetic radiation. A cover wafer is provided having a region thereof transparent to the electromagnetic radiation for passing the electromagnetic radiation through the transparent region onto a surface of the sensing element. A bond gap spacer structure is provided for supporting the surface of the sensing element from an opposing surface of the transparent region of the cover wafer a distance less than a fraction of the predetermined wavelength when the cover wafer is bonded to the device wafer.

14 Claims, 2 Drawing Sheets

(56) References Cited

U.S. PATENT DOCUMENTS

| | | | |
|---|---|---|---|
| 7,262,412 B2 | 8/2007 | Schimert et al. | |
| 7,298,496 B2 | 11/2007 | Hill | |
| 7,358,831 B2 * | 4/2008 | Larson, III | H03H 9/02102 333/187 |
| 7,375,331 B2 | 5/2008 | Schimert et al. | |
| 7,427,819 B2 * | 9/2008 | Hoen | G01P 15/097 310/320 |
| 7,459,686 B2 | 12/2008 | Syllaios et al. | |
| 7,462,831 B2 | 12/2008 | Gooch et al. | |
| 7,508,286 B2 * | 3/2009 | Ruby | H03H 3/04 333/189 |
| 7,535,093 B1 | 5/2009 | Ables et al. | |
| 7,566,942 B2 | 7/2009 | Viens et al. | |
| 7,615,833 B2 * | 11/2009 | Larson, III | H03B 5/326 257/416 |
| 7,630,590 B2 | 12/2009 | Rahman et al. | |
| 7,657,129 B2 | 2/2010 | Karras | |
| 7,867,874 B2 * | 1/2011 | Ables | B81C 1/00095 257/E21.499 |
| 7,876,114 B2 | 1/2011 | Campbell et al. | |
| 7,977,208 B2 | 7/2011 | Ables et al. | |
| 8,288,290 B2 | 10/2012 | Carothers | |
| 8,440,973 B1 | 5/2013 | Fernandez et al. | |
| 8,454,789 B2 | 6/2013 | Diep et al. | |
| 8,847,373 B1 * | 9/2014 | Summers | H01L 23/26 257/682 |
| 8,853,845 B2 * | 10/2014 | Souriau | B81B 7/007 257/678 |
| 2002/0169394 A1 * | 11/2002 | Eppstein | A61B 5/00 600/573 |
| 2003/0183921 A1 * | 10/2003 | Komobuchi | B81B 7/0077 257/704 |
| 2005/0025199 A1 * | 2/2005 | Ma | H01S 5/141 372/20 |
| 2006/0124831 A1 * | 6/2006 | Schimert | H01L 27/1465 250/214 R |
| 2007/0108388 A1 * | 5/2007 | Lane | G01J 1/04 250/353 |
| 2007/0138394 A1 * | 6/2007 | Lane | G01J 1/04 250/353 |
| 2007/0138395 A1 * | 6/2007 | Lane | G01J 1/04 250/353 |
| 2008/0202209 A1 * | 8/2008 | Lambkin | G01J 1/04 73/31.05 |
| 2009/0295277 A1 * | 12/2009 | Logunov | H01J 9/261 313/504 |
| 2011/0180893 A1 * | 7/2011 | Minegishi | H01L 27/14618 257/432 |
| 2012/0068300 A1 * | 3/2012 | Summers | B81C 1/00 257/531 |
| 2012/0097415 A1 * | 4/2012 | Reinert | H01L 27/14618 174/50 |
| 2013/0221497 A1 * | 8/2013 | Baillin | B81C 1/00 257/629 |
| 2013/0344638 A1 * | 12/2013 | Diep | G01J 5/045 438/66 |
| 2014/0087099 A1 * | 3/2014 | Veerasamy | E06B 3/6775 428/34 |
| 2014/0175590 A1 * | 6/2014 | Gooch | H01L 31/0203 257/433 |
| 2015/0048470 A1 * | 2/2015 | Reinert | G01J 5/046 257/432 |

\* cited by examiner

WAFER LEVEL PACKAGED INFRARED (IR) FOCAL PLANE ARRAY (FPA) WITH EVANESCENT WAVE COUPLING

TECHNICAL FIELD

This disclosure relates generally to IR focal plane arrays and more particularly to wafer level packaged (WLP) focal plane arrays.

BACKGROUND

As is known in the art, Microelectromechanical systems (MEMS) are integrated micro devices or systems combining electrical and mechanical components. MEMS devices may be fabricated using, for example, standard integrated circuit batch processing techniques. Exemplary applications for MEMS devices include sensing, controlling, and actuating on the micro scale. Such MEMS devices may function individually or in arrays to generate effects on a macro scale.

As is also known in the art, many MEMS devices require a vacuum environment in order to attain maximum performance. The vacuum package also provides protection and an optimal operating environment for the MEMS device. Specific examples of these MEMS devices include infrared MEMS such as bolometers, sometimes referred to as microbolometers, and certain inertial MEMS such as gyros and accelerometers. Previously, MEMS devices have been individually packaged in vacuum compatible packages after fabrication and dicing of the MEMS device. Often, however, the cost of packaging MEMS devices in traditional metal or ceramic packages may be on the order of about 10 to 100 times the device fabrication cost. This especially true if a vacuum is required in the package. These high packaging costs therefore make it difficult to develop commercially viable vacuum packaged MEMS devices. In addition, MEMS devices are fragile especially after dicing. Care must be taken in handling these devices, and traditional integrated circuit fabrication machinery cannot adequately handle and protect MEMS devices. Thus, special handling techniques have also been developed to protect the MEMS devices until vacuum packaging has been completed. These special handling procedures also add additional cost to the production of MEMS devices.

Over the years, various types of infrared detectors have been developed. Many include a substrate having thereon a focal plane array, the focal plane array including a plurality of detector elements that each correspond to a respective pixel. The substrate contains an integrated circuit which is electrically coupled to the detector elements, and which is commonly known as a read out integrated circuit (ROIC) and which is used to integrate the signal from each detector element and multiplex the signals off the chip with appropriate signal conditioning and processing.

Each detector element includes a membrane which is suspended at a location spaced above the top surface of the substrate, in order to facilitate thermal isolation. The membrane includes a thermally sensitive material, such as amorphous silicon (a-Si) or vanadium oxide (VOx). The membrane also includes two electrodes, which are each coupled to the thermally sensitive material, and which are also coupled to the ROIC in the substrate. As the temperature of the thermally sensitive material varies, the resistance of the thermally sensitive material also varies, and the ROIC in the substrate can determine the amount of thermal energy which has been received at a detector element by sensing the corresponding resistance change of that detector element.

As is the case with certain microelectromechanical (MEMS) devices, bolometers may need to be packaged in vacuum conditions for best performance. Exemplary requirements for the packaging of bolometer arrays include reliable hermetic sealing, the integration of IR window material with good infrared transmission, and high yield/low cost packaging. Both the reliability and the cost of MEMS devices depend upon encapsulation techniques chosen. For MEMS based bolometers, packaging may be done at the chip level or at the wafer level. A common way of packaging in this instance is to fabricate a protective, IR-transmitting cap wafer, or Window Cap Wafer (WCW), and bond it to an exposed surface of the semiconductor substrate, or device wafer, containing the active IR detector bolometer areas prior to dicing. The cap wafer, sometimes, also referred to as a cover or lid structure, is formed with cavities therein such that when the cap wafer is flipped and bonded to the device wafer, the cavities provide sufficient clearance to accommodate and protect the MEMS devices therein.

Uncooled infrared focal plane arrays operating at ambient temperature and without the use of active temperature stabilization require infrared optically blind reference pixels that do not absorb incident infrared radiation. These infrared optically blind reference pixels are used to determine ambient temperature of the focal plane which is required in the calibration of the focal plane array over the operating temperature of the focal plane array. This involves implementation of a gain and offset correction algorithm at any given temperature (sensed by the reference pixels) to the active detector elements in order to correct the image for ambient temperature drift effects, e.g., in an imaging focal plane array.

In the past, reference pixels have been made infrared optically blind by using short thermal isolation legs for the suspended infrared absorbing element in combination with placement of an infrared reflecting aluminum metallization directly on the reference pixel. However, reference pixels fabricated in this way have less Joule heating (e.g., in a voltage-biased suspended microbolometer structure) due to the shorter legs and to a lesser extent the added thermal mass of the aluminum reflector. As such, the output of the reference pixel as read out using a ROIC tends to diverge from the output of the infrared responsive suspended pixel detector elements, thereby limiting dynamic range both in terms of scene temperature and ambient temperature operating ranges.

As noted above, a cap wafer is formed with cavities therein such that when the cap wafer is flipped and bonded to the device wafer, the cavities provide sufficient clearance to accommodate and protect the MEMS devices therein. As also noted above, the cap is typically an infrared-transparent cover, or lid structure. These lids are often coated with an anti-reflective (AR) coating to reduce the reflective properties and increase the infrared transmission properties of the lid. In many applications, a WLP IR FPA package has a 300 um deep cavity with an ARC in the cap wafer to put the cap optical window as far from pixel plane as possible in order to minimize shadowing effect of optical defects in the image plane As is also known in the art, some of these MEMS devices require antireflection coatings (ARCs).

As noted above, one such it detector is a bolometer. Bolometers are devices that act as thermal infrared (IR) sensors by absorbing electromagnetic radiation and thus increase their temperature. The resulting temperature increase is a function of the radiant energy striking the bolometer and is measured with for example, thermoelectric, pyroelectric, resistive or other temperature sensing principles. In the context of uncooled infrared imaging technologies, an infrared bolometer focal plane array (FPA) typically refers to resistive microbolometers, in which a temperature increase is measured by a corresponding resistance change. More specifically, a microbolometer is a type of resistor used as a detector in a thermal camera, for example. The microbolometer may include a tiny vanadium oxide or amorphous silicon resistor with a large temperature coefficient on a silicon element with large surface area, low heat capacity and good thermal isolation. Infrared radiation from a specific range of wavelengths strikes the vanadium oxide or amorphous silicon and changes its electrical resistance. Changes in scene temperature cause changes in the bolometer temperature, which are converted to electrical signals and processed into an image.

With regard to the ARC, a cavity, the floor of which becomes the inner surface of the window, is normally formed in the WCW to space the inside of the WCW away from the device wafer having the FPA detectors in order that defects in the ARC and window surface do not cast shadows on the FPA, which would appear as optical defects in the camera image. The cavity is formed with a Deep Reactive Ion Etch (DRIE). The DRIE cavity etching requires hours of etching per wafer. Controlling the window-detector gap can be accomplished by forming spacers between the device wafer and the WCW using layers of materials already employed in the fabrication of the detectors and package.

Today, in a wafer level packaged bolometer IR FPA, the window cap wafer (WCW) may have greater cost that the read-out IC wafer. Further, today, the WCW is typically a silicon-on-insulator (SOI) wafer. A substantial amount of the WCW cost is in the starting wafer (~$400). Further, a Deep Reactive Ion Etch (DRIE) process is used to etch the cavity, with the oxide in the costly SOI wafer serving as an etch stop layer, and define the optical window at a cost of ~$200, and the anti-reflective coating (ARC) on the inner surface costs about $500 per wafer.

SUMMARY

In accordance with the disclosure, a structure is provided for detecting electromagnetic radiation having a predetermined wavelength. The structure includes a device wafer having a sensing element disposed on a predetermined region of a surface of the device wafer responsive to the electromagnetic radiation. A cover wafer is provided having a region thereof transparent to the electromagnetic radiation for passing the electromagnetic radiation through the transparent region onto a surface of the sensing element. A bond gap spacer structure is provided for supporting the surface of the sensing element from an opposing surface of the transparent region of the cover wafer a distance less than a fraction of the predetermined wavelength when the cover wafer is bonded to the device wafer.

In one embodiment, the bond gap spacer forms a gap between the surface of the sensing element and the opposing surface of the transparent region of the cover wafer to enable evanescent wave coupling across the gap.

With such an arrangement, the need for an SOI Si cap wafer, a tightly controlled DRIE cavity etching process, and an antireflective coating on the inside surface of the cap wafer is eliminated. The method and structure position the inner surface of the window of the WCW within a small fraction of the wavelength of radiant energy of interest from the radiation detector devices using a bond gap control spacer. By having a rigid, fixed, small fractional gap, the radiant energy passes between the inner surface of the window or radiation transparent region onto the surface of the radiation detector device by evanescent wave coupling thereby eliminates an ARC and hence eliminates the requirement for etching a cavity in the WCW and the requirement of the etch stop effect of the oxide in the SOI wafer.

Further, with such an arrangement, etching of cavity is eliminated, depositing the ARC on the inner cap wafer surface is eliminated, and the SOI is replaced with a bulk silicon wafer.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
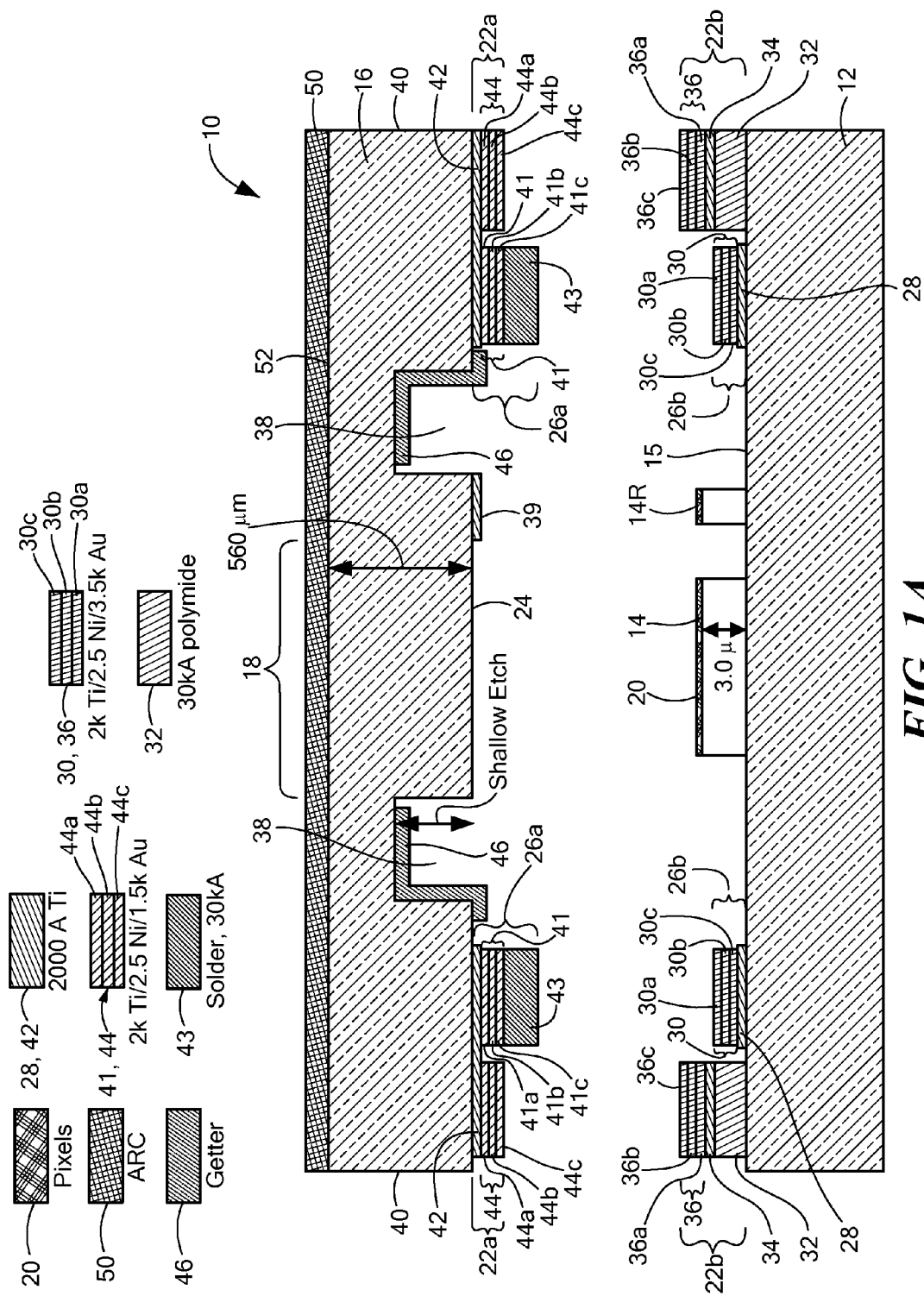
FIG. 1A is an exploded view of a focal plane array having a cover wafer and a device wafer according to the disclosure prior to bonding the cover wafer to the device wafer.
Figure 1B:
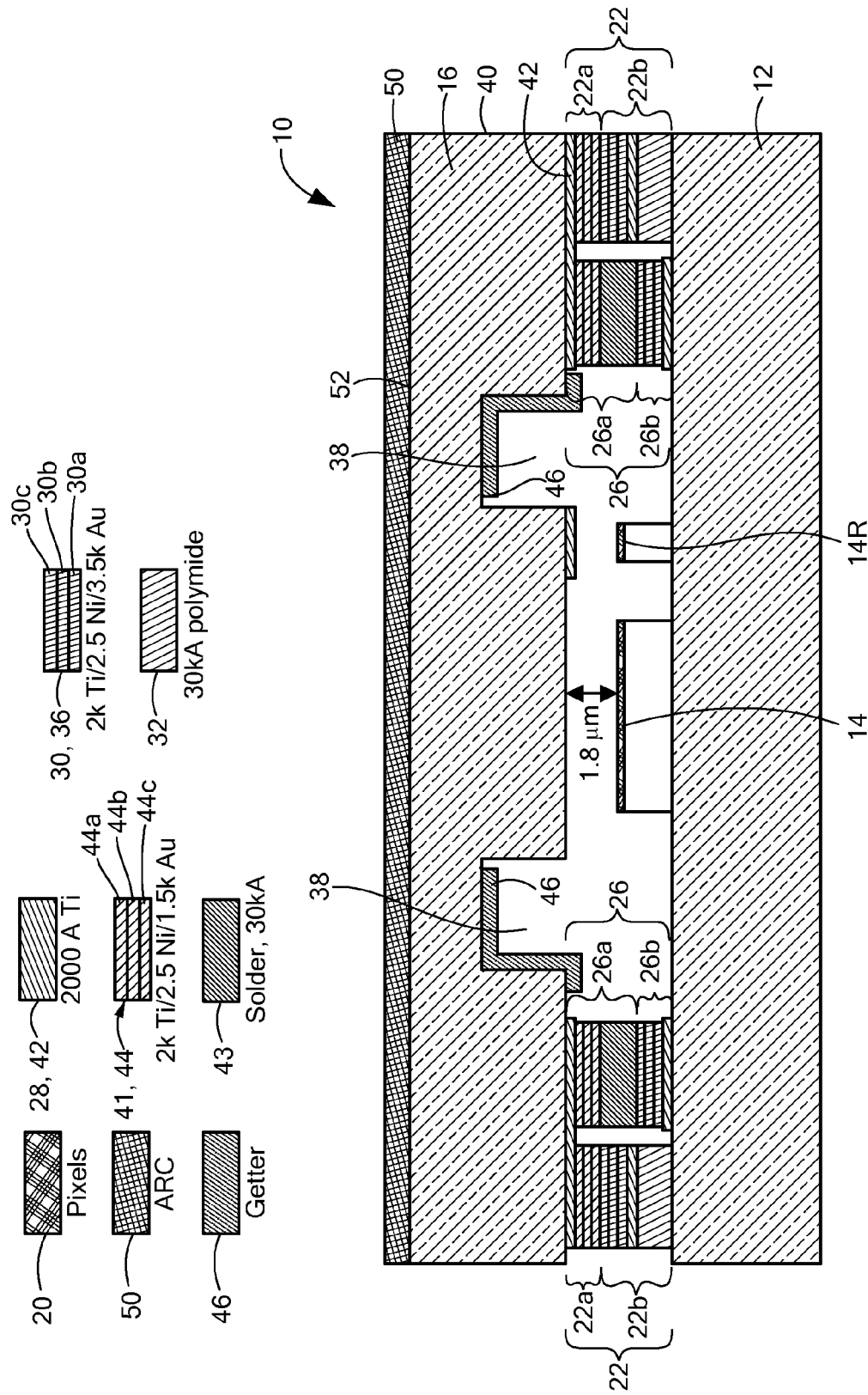
FIG. 1B is a view of a focal plane array of FIG. 1A having the cover wafer and the device wafer according to the disclosure after bonding the cover wafer to the device wafer.

Referring now to FIG. 1A, a focal plane array structure 10 is shown for detecting electromagnetic radiation having a predetermined wavelength. The structure 10 includes a device wafer 12 having a sensing element 14, here for example a microbolometer, disposed on a predetermined region of an upper surface 15 of the device wafer 12 responsive to the electromagnetic radiation. A cover wafer 16 is provided having a region 18 thereof transparent to the electromagnetic radiation for passing the electromagnetic radiation through the transparent region 18 onto a surface 20 of the sensing element 14, here a bolometer. It is noted that a reference detector device 14R is disposed on the surface of the device wafer 12. A bond gap spacer structure 22 is provided for supporting (spacing) the surface 20 of the sensing element 14 from an opposing surface 24 of the transparent region 18 of the cover wafer 16 a predetermined distance D (FIG. 1B) less than a fraction of the predetermined wavelength when the cover wafer 16 is bonded to the device wafer 12, as shown in FIG. 1B. By having a rigid, fixed, small fractional gap, D, the radiant energy passes between the inner surface portion 18, or optical window, onto the surface of the radiation detector device 14 by evanescent wave coupling thereby eliminating an ARC and hence eliminating the requirement for etching a cavity in the WCW and the requirement of the etch stop effect of the oxide in the SIO wafer. Here, for example, the wavelength being detected has a wavelength of about 7 to 13 micrometers and the gap D is about 10,000 to 25,000 Angstroms.

More particularly, the device wafer 12 (FIG. 1A) is here a silicon wafer having, in addition to the detector device 14 and reference detector 14R, a Read Out Integrated Circuit (ROIC), details not shown, and a lower portion 26b of a seal ring and soldering structure 26, shown in FIG. 1B, and a lower portion 22b of the bond gap spacer structure 22 (FIG. 1B). The height of the detector device 14 is here, for example, 30,000 Angstroms and the height of the reference detector is 14R here also 30,000 Angstroms. Here, the height of the seal ring and soldering structure 26 is 48,000 Angstroms and the height of the bond gap spacer structure 22 is also 48,000 Angstroms. Thus, the gap D (FIG. 1B) as noted above is here about 18,000 Angstroms.

More particularly, here, the lower portion 26b (FIG. 1A) of the seal ring and soldering structure 26 includes: a lower layer 28 of titanium, here for example, 2000 Angstroms thick, and a layer 30 comprised of layer 30a of titanium, 2000 A thick, layer 30b of nickel 2500 Angstroms thick, and layer 30c of gold 3500 Angstroms thick, here for example, a total of 10,000 Angstroms thick. Here, the lower portion 22b of the bond gap spacer structure 22 has a lower polyimide layer 32, here for example having a thickness of 30,000 Angstroms, and an middle layer 34 of titanium, here 2000 Angstroms thick, and upper metal structure 36 having: for example, a 2000 Angstroms thick titanium lower 36a layer, a 2500 Angstroms thick middle layer of nickel 36b and a 3500 Angstroms thick top layer 36c of gold. Structures 34 and 36 are formed simultaneously with, and are equivalent to, structures 28 and 30, respectively.

Referring now to the cover wafer 16 in FIG. 1A, here the cover wafer 16 is silicon having a thickness of about 500 to 700 microns, nominally about 560 micrometers, the wafer 16 having a groove 38, here a depth of about 25 to 50 micrometers etched into surface 24, as shown, disposed about the window 18, the window 18 being disposed in the inner portion of the cover wafer 16, as shown. The upper portions 22a and 26a, of the bond gap spacer structure 22 and the seal ring and soldering structure 26, are disposed on the outer portion of the surface on the cover wafer 16; more particularly, the portion of the surface of the cover wafer 16 between the groove 38 and the outer edge 40 (FIG. 1B) of the cover wafer 16, as shown.

More particularly, the upper portions 22a (FIG. 1A) of the bond gap spacer structure 22 (FIG. 1B) includes, in this example, a 2000 Angstroms thick layer 42 of titanium directly on the surface of the cover wafer 16, and a structure 44 on layer 42, the structure 44 having: a 2000 Angstroms thick bottom layer 44a of titanium; a 2500 thick middle layer 44b of nickel, and a 1500 Angstroms thick layer top of gold 44c. The upper portion 26a of the seal ring and soldering structure 26 includes an extended portion of layer 42, a structure 41 (formed at the same time and equivalent to layer 44) having a lower layer 41a of 41a titanium (disposed directly on layer 42), here having a thickness of 2000 Angstroms, a middle layer 41b of nickel, here 2500 Angstroms thick, and a top layer 41c of gold, here 1500 Angstroms thick. A layer 43 of solder here 30000 Angstroms thick is on the gold. When bonded, as shown in FIG. 1B, the solder bonds the layer of gold in the structure 30 of the lower portion 26b of seal ring and soldering structure 26, and the gold in layer 41c of the upper portion 26a of the seal ring structure 26.

A getter material 46 is disposed on the sidewalls of the groove 38 and portions of the bottom of the groove 38 and on a portion of the surface 24 of the cover wafer adjacent to the sidewalls, as shown. The surface 24 of the cover wafer 16 has a piece 39 of titanium, here 2000 Angstroms thick disposed over the reference detector 14R to prevent electromagnetic radiation from impinging upon the reference detector 14R. The reference detector 14R thus has optically blind reference pixels that do not absorb incident infrared radiation. These infrared optically blind reference pixels are used to determine ambient temperature of the focal plane which is required in the calibration of the focal plane array over the operating temperature of the detectors 14, 14R. It is noted that an ARC layer 50 is, in this example, disposed on the outer surface 52 of the cover wafer 16 (FIGS. 1A and 1B).

A number of embodiments of the disclosure have been described. Nevertheless, it will be understood that various modifications may be made without departing from the spirit and scope of the disclosure. For example, the groove 38 may be eliminated providing a flat surface 24 across the cover wafer 16. In such case, the getter would still be used, albeit on the flat surface. Accordingly, other embodiments are within the scope of the following claims.

What is claimed is:

1. A structure for detecting electromagnetic radiation having a predetermined wavelength, comprising: a device wafer having a sensing element disposed on a predetermined region of a surface of the device wafer responsive to the electromagnetic radiation; a cover wafer having a region thereof transparent to the electromagnetic radiation for passing the electromagnetic radiation through the transparent region onto a r:mrfoce of the sensing element; a bond gap spacer structure for supporting the surface of the sensing element from an opposing surface of the transparent region of the cover wafer a predetermined distance less than a fraction of the predetermined wavelength when the cover wafer is bonded to the device wafer, wherein the bond gap spacer forms a gap between the surface of the sensing element and the opposing surface of the transparent region of the cover wafer to enable evanescent wave coupling across the gap.

2. A structure for detecting electromagnetic radiation having a predetermined wavelength, comprising: a device wafer having a sensing element disposed on a predetermined region of a surface of the device wafer responsive to the electromagnetic radiation; a bulk silicon cover wafer having a region thereof transparent to the electromagnetic radiation for passing the electromagnetic radiation through the transparent region onto a surface of the sensing element:

a bond gap spacer structure for supporting the surface of the sensing element from an opposing surface of the transparent region of the bulk silicon cover wafer a predetermined distance less than a fraction of the predetermined wavelength when the cover wafer is bonded to the device wafer, wherein the bond gap spacer forms a gap between the surface of the sensing element and the opposing surface of the transparent region of the cover wafer to enable evanescent wave coupling across the gap.

3. The structure recited in claim 2 wherein the cover wafer has a thickness of about 500 to 700 microns, and a groove having a depth of about 25 to 50 micrometers disposed in surface thereof and disposed about the window, the window being disposed in the inner portion of the cover wafer.

4. The structure recited in claim 2 wherein the bond gap spacer forms a gap between the surface of the sensing element and the opposing surface of the transparent region of the cover wafer to enable evanescent wave coupling across the gap.

5. The structure recited in claim 2, wherein the wavelength is between 7 to 13 micrometers.

6. The structure recited in claim 5 wherein the gap is about 10,000 to 25, 000 Angstroms.

7. The structure recited in claim 3 wherein the wavelength is between 7 to 13 micrometers.

8. The structure recited in claim 7 wherein the gap is about about 10,000 to 25,000 Angstroms.

9. The structure recited in claim 2, wherein the sensing element is a bolometer.

10. The structure recited in claim 2 wherein the sensing element is a bolometer.

11. The structure recited in claim 3 wherein the sensing element is a bolometer.

12. The structure recited in claim 4 wherein the sensing element is a bolometer.

13. The structure recited in claim 5 wherein the sensing element is a bolometer.

14. The structure recited in claim 6 wherein the sensing element is a bolometer.

* * * * *